(12) United States Patent
Kadoi et al.

(10) Patent No.: US 9,337,822 B2
(45) Date of Patent: May 10, 2016

(54) SWITCH CIRCUIT, MASS SPECTROMETER, AND CONTROL METHOD FOR SWITCH CIRCUIT

(71) Applicant: Hitachi High-Technologies Corporation, Tokyo (JP)

(72) Inventors: Ryo Kadoi, Tokyo (JP); Yoshikazu Sugiyama, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 77 days.

(21) Appl. No.: 14/390,096

(22) PCT Filed: Apr. 1, 2013

(86) PCT No.: PCT/JP2013/059943
§ 371 (c)(1),
(2) Date: Oct. 2, 2014

(87) PCT Pub. No.: WO2013/151011
PCT Pub. Date: Oct. 10, 2013

(65) Prior Publication Data
US 2015/0108340 A1    Apr. 23, 2015

(30) Foreign Application Priority Data
Apr. 4, 2012    (JP) ................................. 2012-085770

(51) Int. Cl.
*H03K 17/10*    (2006.01)
*H03K 17/687*    (2006.01)
*H01J 49/02*    (2006.01)

(52) U.S. Cl.
CPC ............ *H03K 17/102* (2013.01); *H01J 49/022* (2013.01); *H03K 17/10* (2013.01); *H03K 17/687* (2013.01); *Y10T 307/747* (2015.04)

(58) Field of Classification Search
CPC ........ H01J 49/02; H01J 49/022; H03K 17/00; H03K 17/04106; H03K 17/04123; H03K 17/04163; H03K 17/10; H03K 17/102; H03K 17/687; H03K 17/6877
USPC .......... 250/281, 282; 327/430, 431, 434–437; 307/112, 125
See application file for complete search history.

(56) References Cited

U.S. PATENT DOCUMENTS

| | | | | |
|---|---|---|---|---|
| 6,414,533 | B1 * | 7/2002 | Graves ................. | H03K 17/162 327/318 |
| 2006/0087343 | A1 | 4/2006 | Himi et al. | |
| 2007/0236274 | A1 * | 10/2007 | Huang ................. | H03K 17/102 327/427 |

(Continued)

FOREIGN PATENT DOCUMENTS

| FR | 2803456 A1 * | 7/2001 | ............ H01L 27/088 |
|---|---|---|---|
| JP | 60-93820 A | 5/1985 | |

(Continued)

*Primary Examiner* — Michael Logie
*Assistant Examiner* — David E Smith
(74) *Attorney, Agent, or Firm* — Baker Botts L.L.P.

(57) ABSTRACT

To provide a switch circuit in which ON/OFF control can be realized even in a state where high voltage is not applied, and high voltage can be completely lowered to the ground.
Provided is a switch circuit that includes plural MOS switches connected in series in such a manner that the source of one element is connected to the drain of another between high voltage and a system ground and that switches a connection state between the high voltage and the system ground, the switch circuit including: a MOS switch 101 the source of which is connected to the system ground among the plural MOS switches; a MOS switch 102 the source of which is connected to the drain of the MOS switch 101 in a shared manner and the drain of which is connected to the high voltage side among the plural MOS switches; a MOS switch 103 the drain of which is connected to the gate of the MOS switch 102 in a shared manner; and a resistor 104 that is connected in parallel between the gate and the source of the MOS switch 102.

12 Claims, 10 Drawing Sheets

(56) References Cited

U.S. PATENT DOCUMENTS

2007/0285141 A1* 12/2007 Yang .................... H02J 7/0065
327/198
2011/0156794 A1* 6/2011 Guo ................ H03K 17/04123
327/419

FOREIGN PATENT DOCUMENTS

| JP | 10-276076 A | 10/1998 |
| JP | 2006-148058 A | 6/2006 |
| JP | 2011-18892 A | 1/2011 |
| WO | 2007/029327 A | 3/2007 |

* cited by examiner

SWITCH CIRCUIT, MASS SPECTROMETER, AND CONTROL METHOD FOR SWITCH CIRCUIT

TECHNICAL FIELD

The present invention relates to a switch circuit, a mass spectrometer, and a control method for a switch circuit, and particularly to a high-voltage switch circuit.

BACKGROUND ART

In order to solve problems of withstand voltage of elements configuring a circuit for controlling high voltage, there has been already proposed a method in which plural transistor elements are connected in series between high voltages, so that voltage applied to the respective transistor elements is dispersed (for example, see Patent Literature 1).

In the circuit according to the invention disclosed in Patent Literature 1, n pieces of transistor elements that are insulated and separated from each other are connected in series between ground potential and high potential, and the gate of the transistor element arranged nearest to the ground potential side serves as an input. Further, n pieces of resistor elements are connected in series between the ground potential and the high potential, and the gates of the respective transistor elements other than one arranged nearest to the ground potential side are connected to connection points of the respective resistor elements in a shared manner. In addition, an output is extracted from the high potential side of each transistor element.

CITATION LIST

Patent Literature

Patent Literature 1: Japanese Patent Application Laid-Open No. 2006-148058

SUMMARY OF INVENTION

Technical Problem

In the case where high-voltage switching is performed using MOSFETs, switching exceeding the withstand voltage of the MOSFETs cannot be performed. In the method disclosed in Patent Literature 1, n pieces of transistor elements are connected in series, so that voltage applied to the respective transistor elements is reduced to one n-th to solve the problems. However, in the case of the configuration disclosed in Patent Literature 1, ON/OFF control cannot be performed unless sufficient voltage is kept to be applied to the high voltage side.

Further, some circuits are used to lower to the ground potential by grounding the high voltage side according to purposes of circuits. On the contrary, even if all of transistor elements are turned on and grounded in the case of the configuration disclosed in Patent Literature 1, when the gate-to-source voltage of the transistor element arranged on the highest potential side falls below the operation voltage of the transistor element due to the lowering of the voltage on the high potential side, the transistor element is turned off, the grounded state is released, and voltage on the high potential side is increased again. Therefore, the voltage on the high potential side cannot be completely lowered to the ground.

In consideration of the above-described problems, an object of the present invention is to provide a switch circuit in which ON/OFF control can be realized even in a state where high voltage is not applied, and high voltage can be completely lowered to the ground.

Solution to Problem

In order to solve the above-described problems, according to one aspect of the present invention, provided is a switch circuit that includes plural transistor elements connected in series in such a manner that the source of one element is connected to the drain of another between high voltage and a system ground and that switches a connection state between the high voltage and the system ground, the switch circuit including: a first transistor element the source of which is connected to the system ground among the plural transistor elements; a second transistor element the source of which is connected to the drain of the first transistor element in a shared manner and the drain of which is connected to the high voltage side among the plural transistor elements; a third transistor element the drain of which is connected to the gate of the second transistor element in a shared manner; and a resistor element that is connected in parallel between the gate and the source of the second transistor element.

Further, according to another aspect of the present invention, provided is a mass spectrometer that allows an ionized sample to fly under a voltage-applied reduced pressure or in a vacuum space and analyzes the mass of the sample by detecting the flying manner, wherein voltage is applied to the space by a power source unit using the switch circuit.

Further, according to still another aspect of the present invention, provided is a control method for a switch circuit that includes plural transistor elements connected in series in such a manner that the source of one element is connected to the drain of another between high voltage and a system ground and that switches a connection state between the high voltage and the system ground, the switch circuit including: a first transistor element the source of which is connected to the system ground among the plural transistor elements; a second transistor element the source of which is connected to the drain of the first transistor element in a shared manner and the drain of which is connected to the high voltage side among the plural transistor elements; a third transistor element the drain of which is connected to the gate of the second transistor element in a shared manner; and a resistor element that is connected in parallel between the gate and the source of the second transistor element, and the control method including the steps of: applying voltage enough to turn on the second transistor element to the source of the third transistor element when the source of the second transistor element is the system ground; disconnecting the high voltage from the system ground by turning off the first transistor element and the third transistor element to turn off the second transistor element; and connecting the high voltage to the system ground by turning on the first transistor element and the third transistor element to turn on the second transistor element.

Advantageous Effects of Invention

According to the configuration of the present invention, it is possible to provide a switch circuit in which ON/OFF control can be realized even in a state where high voltage is not applied, and high voltage can be completely lowered to the ground.

DESCRIPTION OF EMBODIMENTS

First Embodiment

Figure 1:
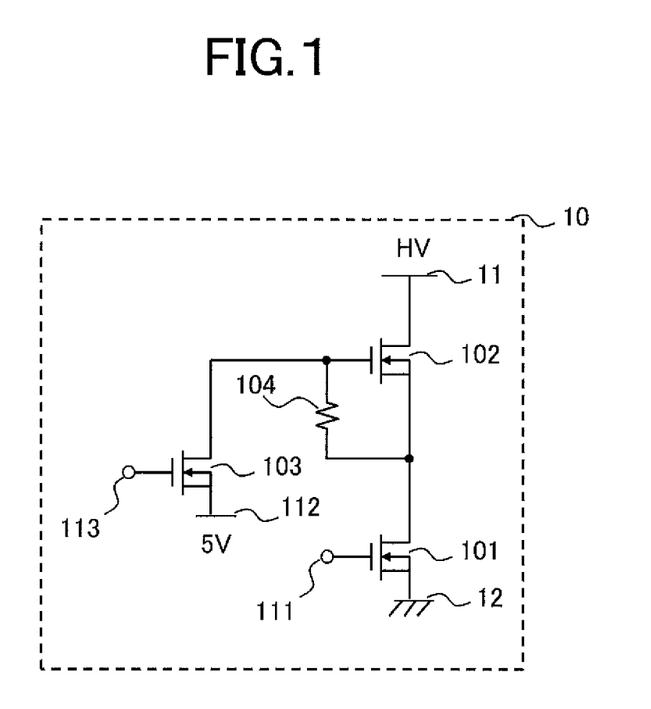
FIG. 1 is a circuit diagram for showing a configuration of a switch circuit according to an embodiment of the present invention.

In the embodiment, an example of a switch circuit in which high-voltage switching is performed will be described. FIG. 1 is a diagram for showing a configuration of a switch circuit 10 according to the embodiment. As shown in FIG. 1, the switch circuit 10 according to the embodiment includes MOS (Metal Oxide Semiconductor) switches 101 to 103 each of which controls ON/OFF of nodes between the drain and the source, a resistor 104 that separates voltage between the gate and the source of the MOS switch 102, a gate terminal 111 of the MOS switch 101, a gate terminal 113 of the MOS switch 103, a gate applied voltage terminal 112 of the MOS switch 102, a floating high-voltage terminal 11, and a ground terminal 12.

As shown in FIG. 1, floating high voltage HV is applied to the floating high-voltage terminal 11. In addition, plural transistor elements are connected in series between the floating high voltage HV and the system ground in the switch circuit 10 according to the embodiment. The plural transistor elements are connected in series in such a manner that the drain of one transistor element is connected to the source of another.

The MOS switch 101 is a first transistor element which is one of the transistor elements connected in series and whose gate serves as an input terminal. The source of the MOS switch 101 is connected to the system ground, and the drain thereof is connected to the source of the MOS switch 102 in a shared manner. The MOS switch 102 is one of the transistor elements connected in series, and the drain thereof is connected to the floating high voltage HV in the switch circuit 10 of FIG. 1.

The MOS switch 103 is a transistor element provided to control ON/OFF of the MOS switch 102. Gate voltage that is high enough to turn on the MOS switch 102 is applied to the gate applied voltage terminal 112 connected to the source of the MOS switch 103 when the source of the MOS switch 102 is at 0 V. As an example in the embodiment, 5 V is applied to the gate applied voltage terminal 112. Further, the drain of the MOS switch 103 is connected to the gate of the MOS switch 102. Accordingly, when the MOS switch 103 is turned on, the voltage applied to the gate applied voltage terminal 112 is applied to the gate of the MOS switch 102.

In the first place, an operation of turning off the switch circuit 10 according to the embodiment will be described. When the switch circuit 10 is to be turned off, 0 V is applied to the gate terminal 111 of the MOS switch 101. At the same time, voltage at the same level as the gate applied voltage terminal 112 is applied to the gate terminal 113 of the MOS switch 103. When 0 V is applied to the gate terminal 111, the gate-to-source voltage difference of the MOS switch 101 becomes 0 V, the MOS switch 101 is turned off, and no current flows between the drain and the source.

As similar to the above, if voltage at the same level as the gate applied voltage terminal 112 is applied to the gate terminal 113 of the MOS switch 103, the gate-to-source voltage difference of the MOS switch 103 becomes 0 V, the MOS switch 103 is turned off, and no current flows between the drain and the source. By performing these operations, routes on which current flows into the resistor 104 do not exist, the gate-to-source voltage of the MOS switch 102 becomes 0 V, and the MOS switch 102 is turned off.

By performing the above-described operations, all of the MOS switch 101, the MOS switch 102, and the MOS switch 103 are turned off, and the ground is disconnected from the high-voltage terminal. Accordingly, the voltage applied to the floating high-voltage terminal 11 is divided into the drain-source of each MOS. Thus, the switch circuit 10 can be turned off without exceeding the drain-to-source withstand voltage of each MOS while preventing the destruction of the elements.

Next, an operation of turning on the switch circuit 10 according to the embodiment will be described. When the switch circuit 10 is to be turned on, gate voltage that is high enough to turn on the MOS switch 101 is applied to the gate terminal 111 of the MOS switch 101. At the same time, gate voltage that is high enough to turn on the MOS switch 101 is applied to the gate terminal 113 of the MOS switch 103. In this case, 5 V and 10 V are applied to the gate terminal 111 and the gate terminal 113, respectively, as an example.

When the MOS switch 101 is turned on, the source voltage of the MOS switch 102 becomes 0 V. In addition, when the MOS switch 103 is turned on, the gate voltage of the MOS switch 102 becomes 5 V. As a result, the gate-to-source voltage of the MOS switch 102 becomes 5 V, and the MOS switch 102 is turned on. By performing the above-described operations, all of the MOS switch 101, the MOS switch 102, and the MOS switch 103 are turned on, and the ground terminal 12 is connected to the high-voltage terminal 11.

Figure 2:
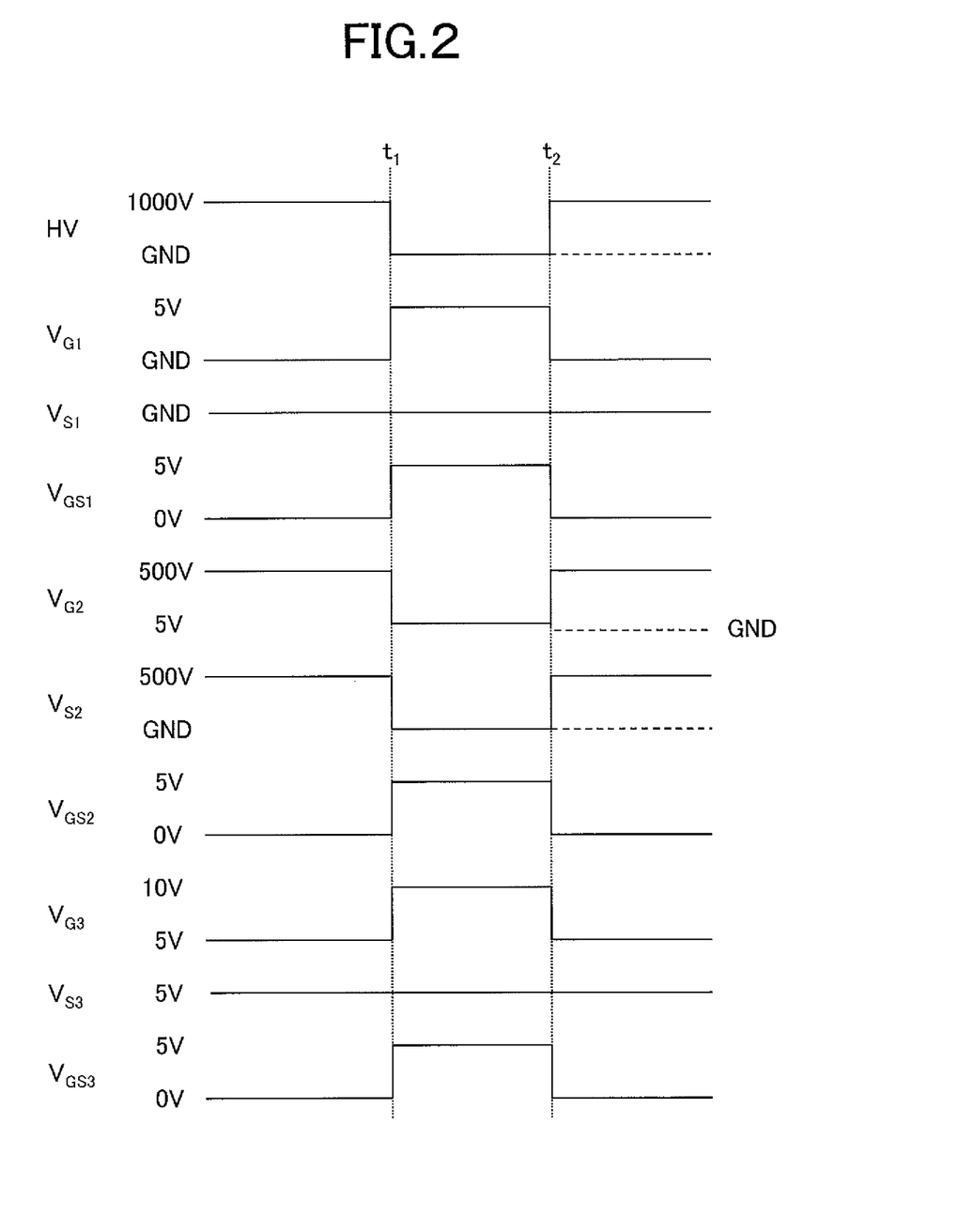
FIG. 2 is a timing chart for showing an operation of the switch circuit according to the embodiment of the present invention.

A timing chart of switching the state in the order of OFF, ON, and OFF is shown in FIG. 2. The timing chart shows each operation timing of gate voltage $V_{G1}$, source voltage $V_{S1}$, and gate-to-source voltage $V_{GS1}$ of the MOS switch 101, gate voltage $V_{G2}$, source voltage $V_{S2}$, and gate-to-source voltage $V_{GS2}$ of the MOS switch 102, and gate voltage $V_{G3}$, source voltage $V_{S3}$, and gate-to-source voltage $V_{GS3}$ of the MOS switch 103.

In FIG. 2, 1000 V is applied to the floating high-voltage terminal 11, and a state in which the switching circuit 10 is turned off, namely, the floating high-voltage terminal 11 is not grounded is set as an initial state. As shown in FIG. 2, in a state where the switching circuit 10 is turned off, the gate voltage $V_{G1}$ of the MOS switch 101 is ground voltage (GND), and the gate voltage $V_{G3}$ of the MOS switch 103 is 5 V that corresponds to the voltage of the gate applied voltage terminal 112. Each of the gate-to-source voltage $V_{GS1}$ and the gate-to-source voltage $V_{GS3}$ becomes 0 V, and the MOS switch 101 and the MOS switch 103 are turned off.

As a result, the floating high voltage HV is divided by the MOS switch 101 and the MOS switch 102, and thus the source voltage $V_{S2}$ of the MOS switch 102 becomes 500 V. In addition, the gate voltage $V_{G2}$ of the MOS switch 102 becomes 500 V through the resistor 104. Thus, the gate-to-source voltage $V_{GS2}$ becomes 0 V, and the MOS switch 102 is turned off.

When the switch circuit 10 is switched to ON at the timing $t_1$, 5 V is first applied as the gate voltage $V_{G1}$ of the MOS switch 101, and 10 V is applied as the gate voltage $V_{G3}$ of the MOS switch 103. As a result, each of the gate-to-source voltage $V_{GS1}$ and the gate-to-source voltage $V_{GS3}$ becomes 5 V, and the MOS switch 101 and the MOS switch 103 are turned on.

When each of the MOS switch 101 and the MOS switch 103 is turned on, the source of the MOS switch 102 is grounded through the MOS switch 101, and the voltage $V_{S2}$ becomes the ground voltage. Further, the gate of the MOS switch 102 is connected to the gate applied voltage terminal 112 through the MOS switch 103, and the voltage $V_{G2}$ becomes 5 V. As a result, the gate-to-source voltage $V_{GS2}$ becomes 5 V, and the MOS switch 102 is turned on. Accordingly, the floating high-voltage terminal 11 is grounded through the MOS switch 102 and the MOS switch 101, and the floating high voltage HV becomes the ground voltage.

As described above, according to the switch circuit 10 of the embodiment, the floating high voltage HV can be reliably lowered to the ground voltage. Next, when the switch circuit 10 is switched to OFF again at the timing $t_2$, the gate voltage $V_{G1}$ of the MOS switch 101 becomes GND, and 5 V is applied as the gate voltage $V_{G3}$ of the MOS switch 103. As a result, each of the gate-to-source voltage $V_{GS1}$ and the gate-to-source voltage $V_{GS3}$ becomes 0 V, and the MOS switch 101 and the MOS switch 103 are turned off.

The subsequent operations differ depending on the state of the floating high voltage HV. When the MOS switch 101 is turned off and the grounded state of the floating high voltage HV is released, operations as shown by solid lines at HV, $V_{G2}$, and $V_{S2}$ of FIG. 2 are carried out as long as the floating high voltage HV can be immediately returned to 1000 V. Specifically, the floating high voltage HV is divided by the MOS switch 101 and the MOS switch 102, and thus the source voltage $V_{S2}$ of the MOS switch 102 becomes 500 V. In addition, the gate voltage $V_{G2}$ of the MOS switch 102 becomes 500 V through the resistor 104. Thus, the gate-to-source voltage $V_{GS2}$ becomes 0 V, and the MOS switch 102 is turned off.

In the case where the resistor 104 is not provided, the gate voltage $V_{G2}$ of the MOS switch 102 remains at 5 V that is applied to the gate applied voltage terminal 112, and the gate-to-source voltage of the MOS switch 102 becomes −495 V. Thus, the destruction of the elements occurs at the MOS switch 102. Providing the resistor element 104 can prevent such a state, and the MOS switch 102 can be turned off by changing the gate-to-source voltage $V_{GS2}$ to 0 V.

On the other hand, if the floating high voltage HV is not returned to 1000 V even after the grounded state of the floating high voltage HV is released, operations as shown by dashed lines at HV, $V_{G2}$, and $V_{S2}$ of FIG. 2 are carried out. Specifically, the source voltage of the MOS switch 102 remains at 0 V, and the gate voltage $V_{G2}$ of the MOS switch 102 becomes 0 V through the resistor 104. Thus, the gate-to-source voltage $V_{GS2}$ becomes 0 V, and the MOS switch 102 is turned off.

In the case where the resistor 104 is not provided, the gate voltage $V_{G2}$ of the MOS switch 102 remains at 5 V that is applied to the gate applied voltage terminal 112, and the gate-to-source voltage of the MOS switch 102 becomes 5 V. Thus, the MOS switch 102 is not turned off. Specifically, by providing the resistor element 104, the MOS switch 102 can be preferably turned off even in a state where the floating high voltage HV is not applied.

As described above, the switch circuit 10 according to the embodiment can reliably lower the floating high voltage HV to the ground potential, and can reliably carry out the ON/OFF operations in any state of the floating high voltage. Further, high voltage is applied between the drains and the sources of the MOS switches of two stages when the switch circuit 10 according to the embodiment is turned off. Thus, high-voltage switching about twice the drain-to-source withstand voltage of the MOS switch can be carried out.

Figure 3:
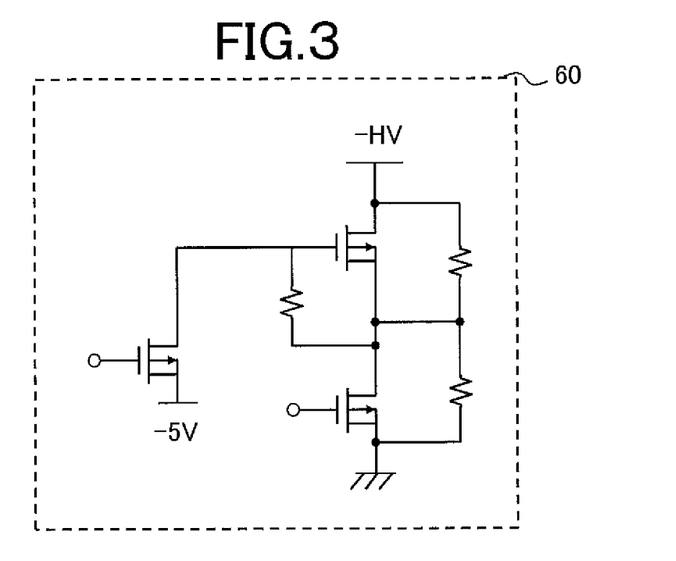
FIG. 3 is a circuit diagram for showing a configuration of the switch circuit according to the embodiment of the present invention.

It should be noted that N-channel MOS transistors are used as the MOS switches in the embodiment. However, a configuration of a switch circuit 60 using P-channel MOS transistors as shown in FIG. 3 may be employed as switches when negative high voltage is applied on the high-voltage terminal side.

Figure 4:
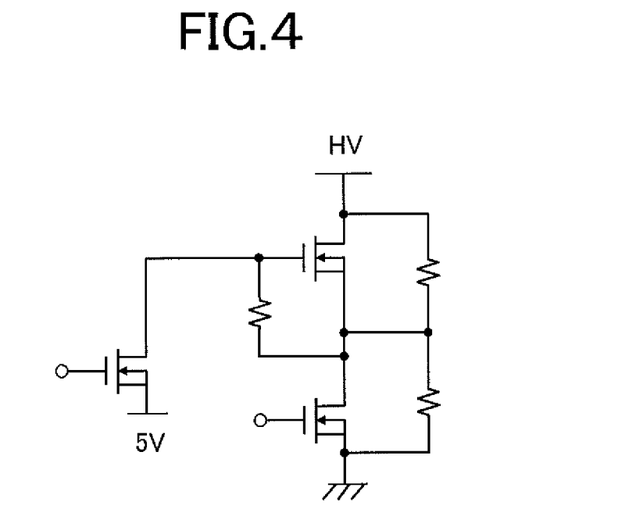
FIG. 4 is a circuit diagram for showing a configuration of the switch circuit according to the embodiment of the present invention.

Further, as shown in FIG. 4, resistors 121 and 122 which are connected in series and whose resistance values are the same are connected in parallel between the drain and the source of the MOS switch 101 and between the drain and the source of the MOS switch 102, respectively, so that voltage applied between the drain and the source of the MOS switch 101 and between the drain and the source of the MOS switch 102 at the time of turning off can be equalized. Accordingly, even if the MOS switch 101 and the MOS switch 102 vary in performance and impedance at the time of OFF, it is possible to prevent such an event that voltage is disproportionately applied to one MOS switch so as to exceed the withstand voltage.

As described above, according to the switch circuit 10 of the embodiment, it is possible to provide a switch circuit in which ON/OFF control can be realized even in a state where high voltage is not applied and high voltage can be completely lowered to the ground.

Second Embodiment

Figure 5:
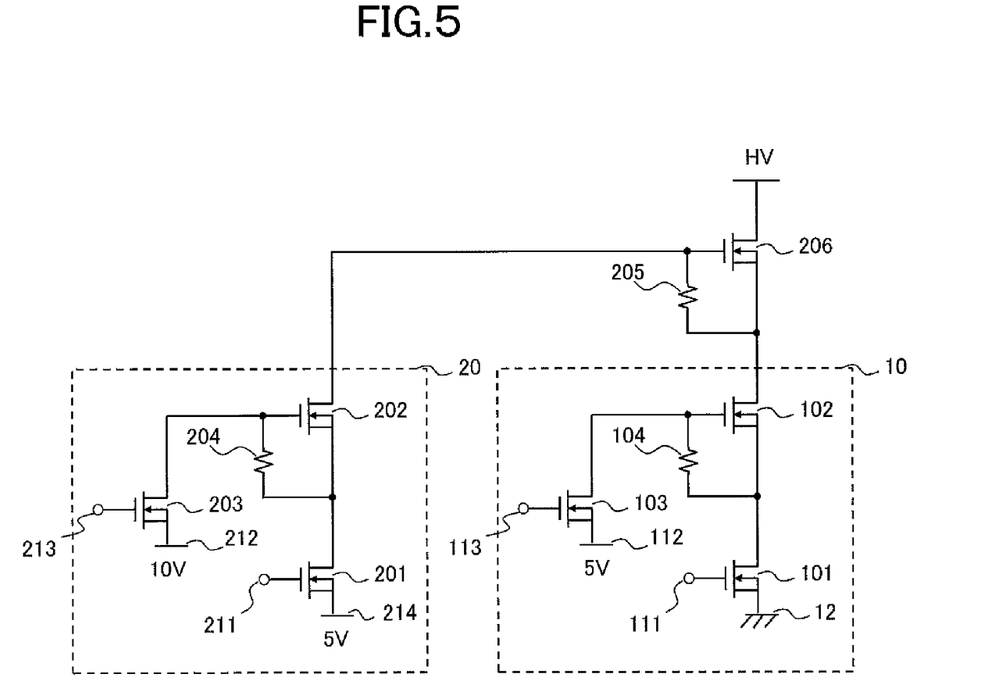
FIG. 5 is a circuit diagram for showing a configuration of the switch circuit according to the embodiment of the present invention.

In the embodiment, a switch circuit using more MOSs than the two-stage transistor connection as shown in FIG. 1 will be described. FIG. 5 is a diagram for showing a switch circuit in the case of using a three-stage transistor configuration. In addition to the switch circuit 10 described in FIG. 1, the switch circuit according to the embodiment includes, as shown in FIG. 5, a MOS switch 206 and a resistor 205 arranged on the drain side of the MOS switch 102. Further, a second-stage switch circuit 20 having the same configuration as the switch circuit 10 is connected to the gate of the MOS switch 206.

The second-stage switch circuit 20 includes, as shown in FIG. 5, MOS switches 201, 202, and 203, a resistor 204, a gate terminal 211 of the MOS switch 201, a gate terminal 213 of the MOS switch 203, a gate applied voltage terminal 212 of the MOS switch 202, and a gate applied voltage terminal 214 to the MOS switch 206.

In other words, in the switch circuit shown in FIG. 5, the drain of the transistor element connected to the highest potential side in a circuit in which the transistor elements the number of which is the same as that of the transistor elements connected in series on the system ground side relative to the transistor elements connected in series between the floating high voltage HV and the system ground are connected in series is connected to the gate of each of the transistor elements. Accordingly, the MOS switches 201 and 202 can be prevented from being destructed by high voltage applied to the gate side of the MOS switch 206 through the resistor 205 when the switch circuit is turned off.

Voltage enough to turn on the MOS switch 206 when the source voltage of the MOS switch 206 is 0 V is applied to the gate applied voltage terminal 214, and voltage to turn on the MOS switch 202 when the source voltage of the MOS switch 202 corresponds to voltage applied to the gate applied voltage terminal 214 is applied to the gate applied voltage terminal 212. As an example, 5 V and 10 V are applied to the gate applied voltage terminal 214 and the gate applied voltage terminal 212, respectively.

In the first place, an operation of turning off the switch circuit according to the embodiment will be described. The operation of turning off the switch circuit 10 is the same as that of the first embodiment. To each of the gate terminal 211 of the MOS switch 201 and the gate terminal 213 of the MOS switch 203, applied is voltage at the same level as the source voltage of each MOS. In the embodiment, 5 V and 10 V are applied to the gate terminal 211 and the gate terminal 213, respectively. Accordingly, the gate-to-source voltage of each of the MOS switch 201 and the MOS switch 203 becomes 0 V. Thus, the MOS switch 201 and the MOS switch 203 are turned off, and routes on which current flows into the resistor 204 do not exist. Thus, the gate voltage and the source voltage of the MOS switch 202 become the same potential.

By performing the operation, the MOS switch 202 is turned off, and the switch circuit 10 is also turned off. Thus, routes on which current flows into the resistor 205 do not exist, and the gate-to-source voltage of the MOS switch 206 becomes 0 V. By performing the operation, the MOS switch 206 is turned off, and the all MOSs in the switch circuit are turned off. Accordingly, the voltage applied to the floating high-voltage terminal 11 is divided into the drain-source of each MOS. Thus, the switch circuit can be turned off without exceeding the drain-to-source withstand voltage of each MOS while preventing the destruction of the elements.

Next, an operation of turning on the switch circuit according to the embodiment will be described. The operation of turning on the switch circuit 10 is the same as that of the first embodiment. Voltage is applied to each of the gate terminal 211 and the gate terminal 213 so as to turn on the MOS switch 201 and the MOS switch 203 of the second-stage switch circuit 20 at the same time the switch circuit 10 is turned on. As an example, 10 V and 15 V are applied to the gate terminal 211 and the gate terminal 213, respectively, so that the gate-to-source voltage of each MOS switch becomes 5 V. When a predetermined level of voltage is applied to each of the gate terminal 211 and the gate terminal 213, the MOS switch 201 and the MOS switch 203 are turned on. In addition, the source voltage of the MOS switch 202 becomes 5 V, the gate voltage thereof becomes 10 V, and the MOS switch 202 is also turned on.

By performing the operation, the gate voltage of the MOS switch 206 becomes 5 V of the gate applied voltage terminal 214. Further, since the switch circuit 10 is turned on, the source voltage of the MOS switch 206 becomes 0 V, and the MOS switch 206 is also turned on. As a result, the entire switch of FIG. 5 is turned on, and the ground is connected to the high-voltage terminal.

Figure 6:
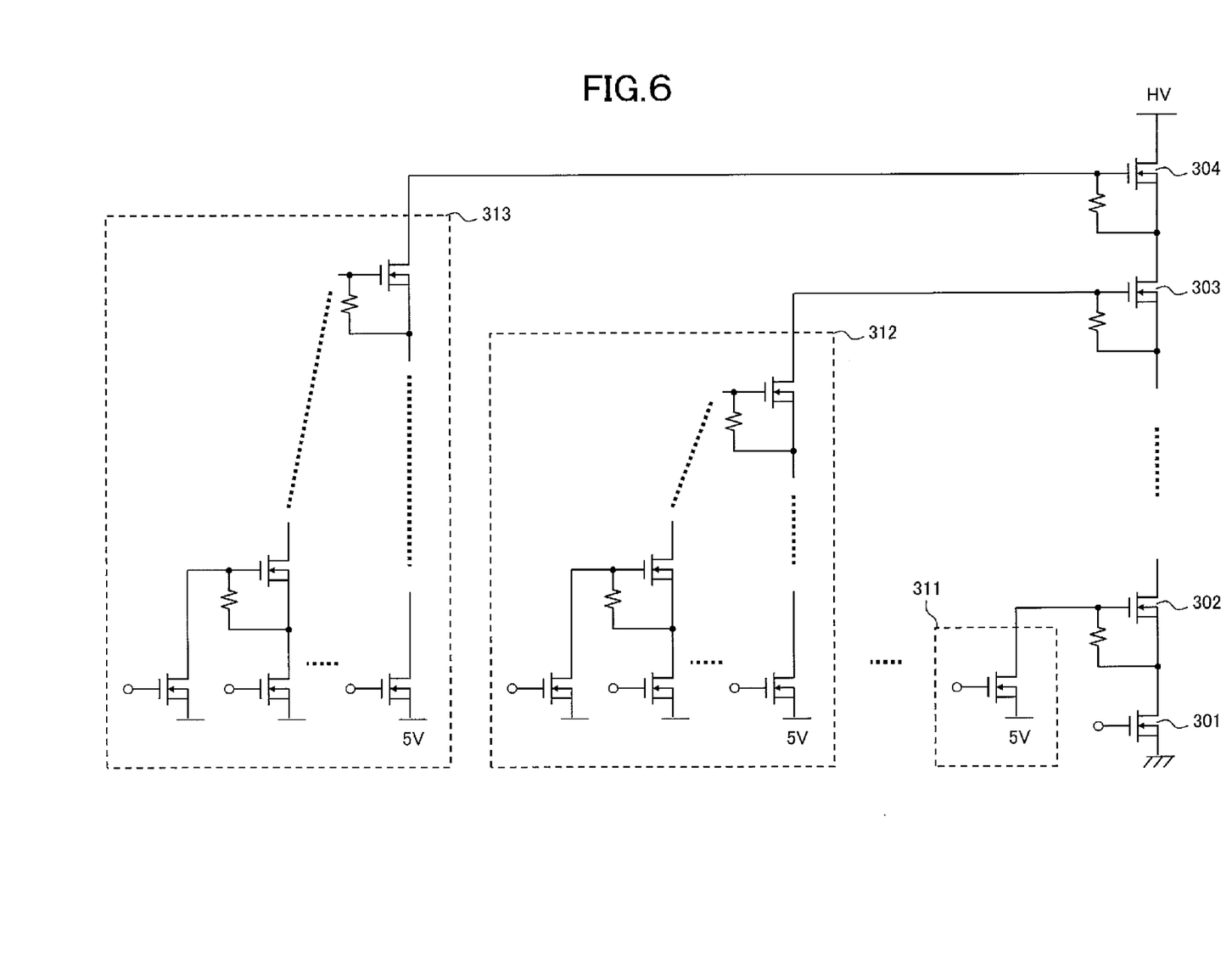
FIG. 6 is a circuit diagram for showing a configuration of the switch circuit according to the embodiment of the present invention.

As shown in FIG. 1, the switch circuit 10 is originally of a two-stage configuration. In FIG. 5, a three-stage configuration is realized by connecting the MOS switch 206. As described above, an example of an n-stage multistage configuration of the MOS switches is shown in FIG. 6. FIG. 6 shows a multistage configuration in which MOS switches 301, 302, 303, and 304 of n stages are connected. Provided is a nested configuration in which a switch circuit 311 having one stage is connected to the gate of the second-stage MOS, a switch circuit 312 having n−2 stages is connected to the gate of the n−1-th-stage MOS, and a switch circuit 313 having n−1 stages is connected to the gate of the n-th-stage MOS. However, voltage necessary to turn on each MOS is applied to the gate applied voltage terminal.

In other words, in the switch circuit shown in FIG. 6, the drain of the transistor element connected to the highest potential side in a circuit in which the transistor elements the number of which is the same as that of the transistor elements connected in series on the system ground side relative to the transistor elements connected in series between the floating high voltage HV and the system ground are connected in series is connected to the gate of each of the transistor elements, as similar to the circuit described in FIG. 5.

Further, a circuit in which the transistor elements the number of which is the same as that of the transistor elements connected in series on the low potential side relative to the transistor elements connected in series to the gates of the MOS switch 304 and the like are connected in series is connected to each of the gates of the transistor elements, and the drain of the transistor element connected to the highest potential side is connected to the gate of the transistor element connected to the gate of the MOS switch 304. Accordingly, as similar to the case of FIG. 5, each transistor element can be prevented from being destructed.

Figure 7:
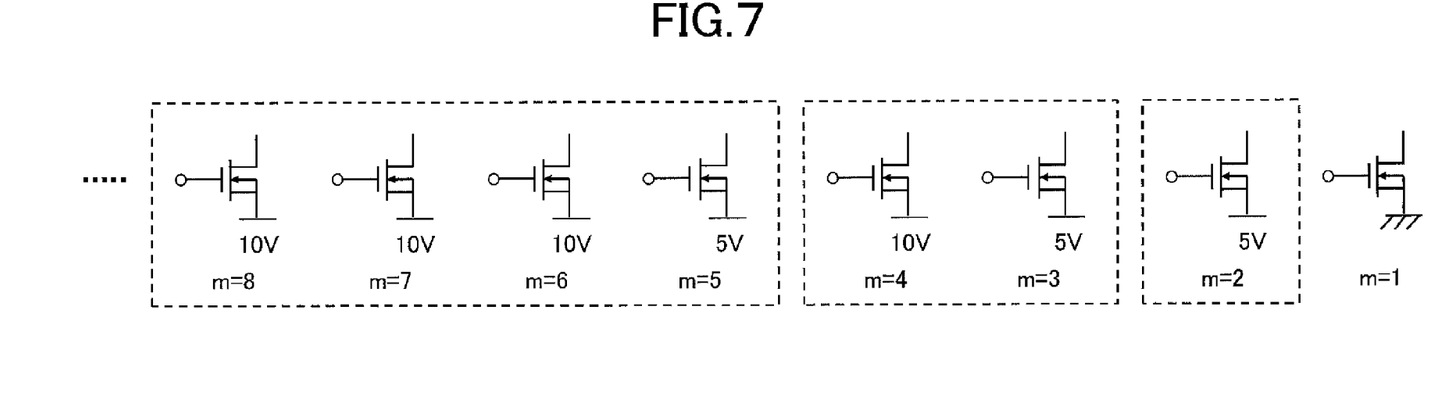
FIG. 7 is a diagram for showing voltage applied to the source of a transistor connected on the lowest potential side in the switch circuit according to the embodiment of the present invention.

FIG. 7 is a diagram in which the lowermost-stage MOS switch of the switch circuit shown in FIG. 6 is extracted. If source terminal (gate voltage applied terminal) numbers m are given in order from the right, voltage $V_m$ applied to each source terminal can be represented by the following equation (1).

$$V_m = V_{m-2}{}^{i-2} + 5 \qquad (1)$$

In this case, the relation between m and i in the equation (1) is represented by the following equation (2), and $V_1$ is 0 and $V_2$ is 5.

$$2^{i-2} < m < 2^{i-1} \qquad (2)$$

Thus, in the ON/OFF control of the entire switch circuit, a voltage of $V_m + 5$ V is applied to the gate of each lowermost-stage MOS switch at the time of the ON operation, so that the MOS switches are turned on. Further, a voltage of $V_m$ is applied to the gate of each MOS switch at the time of the OFF operation, so that the MOS switches are turned off.

As described above, the MOS switches of plural stages are connected, so that voltage applied to one MOS switch corresponds to one n-th of the high voltage at the time of the OFF operation. Thus, high-voltage switching up to n times the drain-to-source withstand voltage of the MOS switch can be carried out.

Further, if the MOS switches 301, 302, 303, and 304 of FIG. 6 are manufactured using the same wafer, variation of each impedance of the MOS switches 301, 302, 303, and 304 can be prevented from occurring, and high voltage can be evenly divided between the drain and the source of each MOS switch when the switch circuit is turned off.

Further, in the case where the MOS switches 301, 302, 303, and 304 are laid out on an actual circuit, it is preferable that the creeping distances between the MOS switches are equalized by linearly arranging the respective MOS switches at regular intervals between the high-voltage terminal and the ground. Accordingly, the symmetry of impedance of each MOS switch can be realized on the layout of a circuit substrate. In addition, high voltage can be evenly divided between the drain and the source of each MOS switch when the switch circuit is turned off. It should be noted that the above-described creeping distance between the MOS switches is a distance between the source of one MOS switch and the drain of the other MOS switch that are arranged adjacent to each other, and is a distance along the surface of an insulator in which the MOS switches are mounted.

The drain-to-source withstand voltage is 1.5 kV in some N-channel MOSFETs. On the other hand, if the high-voltage power source of a mass spectrometer is, for example, 7 kV, the withstand voltage of the entire switch is 7.5 kV on the assumption that n=5 in the n-stage switch circuit and MOSFETs with a drain-to-source withstand voltage of 1.5 kV are used as MOS switches corresponding to the MOS switches 301, 302, 303, and 304. Accordingly, the switch can be used as a switch for the power source of the mass spectrometer.

When switching of the multistage MOS switches as shown in FIG. 5 and FIG. 6 is controlled, the respective MOS switches 301, 302, 303, and 304 of FIG. 6 are turned on or off not at the same time but at different timings in some cases. In this case, high voltage is temporarily concentrated in one MOS switch that is turned off earlier or later than the other MOS switches, and thus destruction possibly occurs by exceeding the drain-to-source withstand voltage of the MOS. Therefore, the MOS switches 301, 302, 303, and 304 are desirably turned on or off at the same time.

In this case, among the MOS switches 301, 302, 303, and 304, the switch on the higher voltage side has more stages of the MOS switches of the circuits that control the gate. For example, the switch circuit 313 having n−1 stages is configured using MOS switches of n−1 stages, and the switch circuit 312 having n−2 stages is configured using MOS switches of n−2 stages. Therefore, the propagation delay $T_{pd}$ of each MOS switch is accumulated, so that the arrival of a switching control signal is delayed.

In order to suppress the delay, while the delay of one MOS transistor is assumed as $T_{pd}$, it is necessary to control the timing of the control signal to eliminate the delay. The delay of switching is determined on the basis of the number of gate terminals provided until the control signal reaches the MOS switches 301, 302, 303, and 304. Further, using source terminal (gate voltage applied terminal) numbers m shown in FIG. 7, an arrival delay time $T_m$ until the result of control in the MOS switch arranged in the lowermost stage reaches the MOS switches that are connected in series between the floating high potential and the ground potential can be obtained by using the following equation (3).

$$T_m = T_{m-2}{}^{i-2} + T_{pd} \tag{3}$$

In this case, the relation between m and i in the equation (3) is represented by the following equation (4), and $T_1$ is 0 and $T_2$ is $T_{pd}$.

$$2^{i-2} < m < 2^{i-1} \tag{4}$$

The gate of the MOS switch in the lowermost stage is turned on or off so as to eliminate $T_m$ thus obtained. For example, in the case of a three-stage configuration, the delay time of the MOS switch of m=4 is $T_4 = 2T_{pd}$; m=3, $T_3 = T_{pd}$; m=2, $T_2 = T_{pd}$; and m=1, $T_1 = 0$. Thus, the gate of m=4 is controlled first at the time of ON/OFF control, the gates of m=2 and 3 are controlled later than the control of the gate of m=4 by $T_{pd}$, and the gate of m=1 is controlled later than the control of the gate of m=4 by $2T_{pd}$.

In the case of the minimum configuration as FIG. 1, the gate control timing of the MOS switch 301 shown in FIG. 6 is set later than that of the switch circuit 311 having one stage. As similar to the above, in the gate control timing contributing to the ON/OFF control of the transistor elements connected in series between the floating high voltage HV and the system ground, namely, the gate control timing of each of the switch circuit 313 having n−1 stages and the switch circuit 312 having n−2 stages, the gate control timing contributing to the ON/OFF control of the transistor elements connected on the system ground side is set later than that contributing to the ON/OFF control of the transistor elements connected on the high voltage side.

Figure 8:
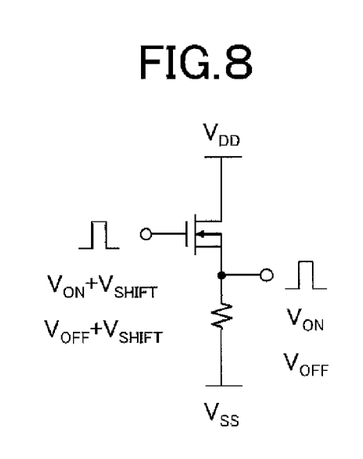
FIG. 8 is a diagram for showing a source follower circuit according to the embodiment of the present invention.

As a circuit for delaying the gate control, a source follower circuit using MOS transistors that are manufactured using the same wafer as MOS switches and have the same propagation delay time as shown in FIG. 8 can be used. The source follower circuit shown in FIG. 8 is configured using power source terminals 401 and 402, an input terminal 403, an output terminal 404, and a MOS transistor 405. In consideration of the level shift of an output of the source follower circuit, voltage obtained by adding level shift voltage $V_{SHIFT}$ to output voltage $V_{ON}$ or $V_{OFF}$ is applied to the input terminal 403. In addition, the source follower circuit outputs $V_{ON}$ or $V_{OFF}$ later than the original input signal by $T_{pd}$.

Figure 9:
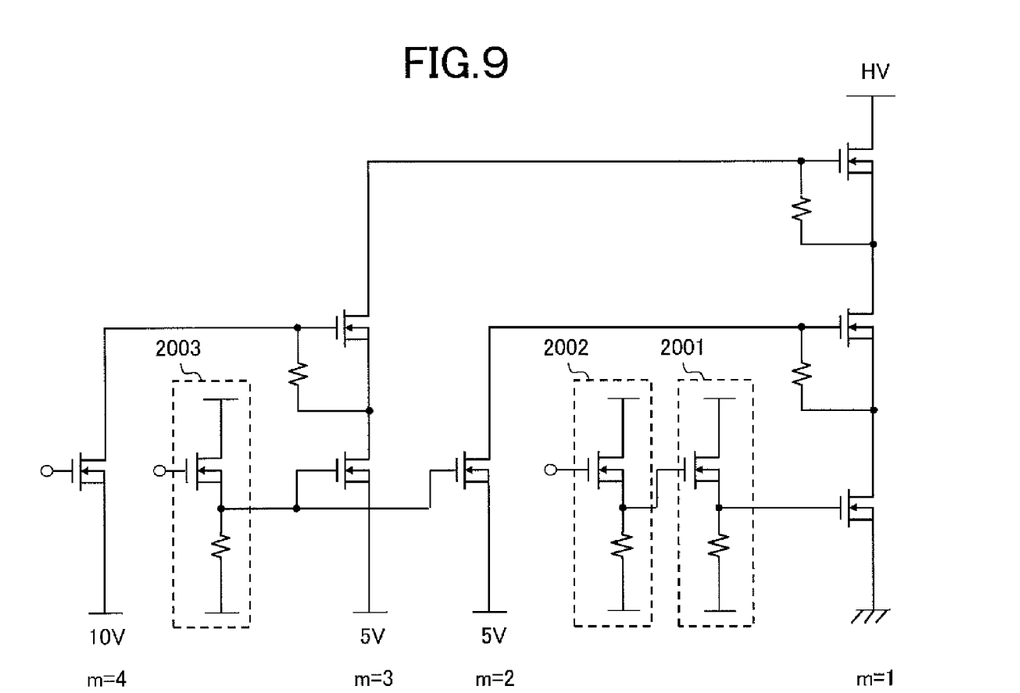
FIG. 9 is a diagram for showing a switch circuit to which the source follower circuit according to the embodiment of the present invention is applied.

The circuit is configured in such a manner that the source follower circuits corresponding to $T_{pd}$ to delay are dependently connected to the respective gate terminals of the switch circuits as delay circuits, and the MOS switches 301, 302, 303, and 304 are turned on or off at the same time. FIG. 9 is a diagram for showing an example of applying the source follower circuit of FIG. 8 to a three-stage switch circuit. In the example of FIG. 9, source follower circuits 2001, 2002, and 2003 are added to the three-stage switch circuit described in FIG. 5. As described above, since the gates of m=2 and 3 are controlled after $T_{pd}$, one source follower circuit 2003 is added. Since the gate of m=1 is controlled after $2T_{pd}$, two source follower circuits 2001 and 2002 are added. As described above, due to the level shift of the source follower circuit, it is desirable that a level shift voltage of $+V_{SHIFT}$ and a level shift voltage of $+2V_{SHIFT}$ are applied to the gate control voltage of the source follower circuit 2003 and the gate control voltage of the source follower circuit 2002, respectively.

Third Embodiment

Figure 10:
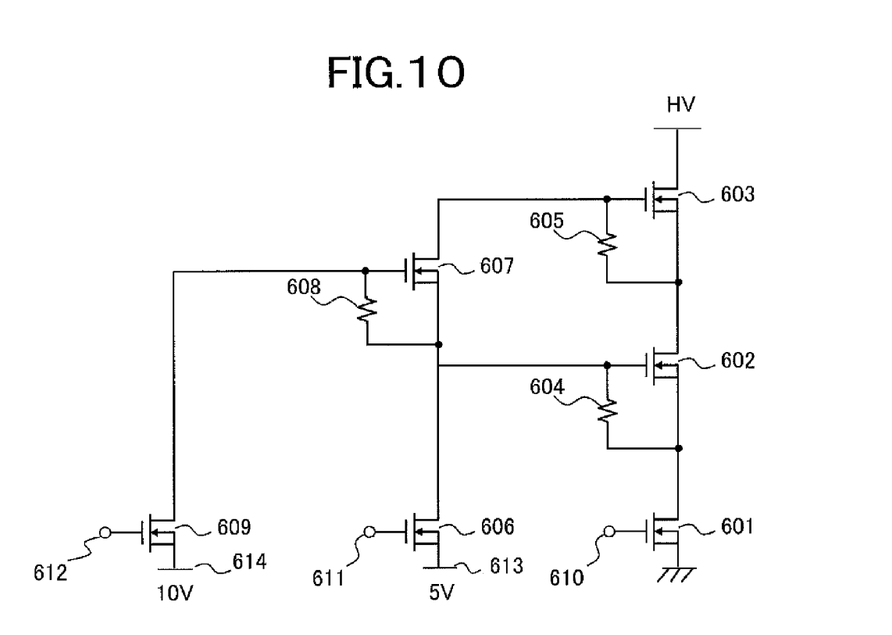
FIG. 10 is a circuit diagram for showing a configuration of the switch circuit according to the embodiment of the present invention.

In the embodiment, an example of simplifying the multistage configuration circuits as described in FIG. 5 and FIG. 6 will be described. FIG. 10 is a diagram for showing a switch circuit according to the embodiment obtained by simplifying the three-stage switch circuit described in FIG. 5.

As shown in FIG. 10, the switch circuit according to the embodiment includes MOS switches 601, 602, 603, 606, 607, and 609, resistors 604, 605, and 608, a gate terminal 610 of the MOS switch 601, a gate terminal 611 of the MOS switch 606, a gate terminal 612 of the MOS switch 609, and gate applied voltage terminals 613 and 614.

Voltage to turn on the MOS switches 602 and 603 is applied to the gate applied voltage terminal 613 when the source voltage of each of the MOS switches 602 and 603 is 0 V, and voltage to turn on the MOS switch 607 is applied to the gate applied voltage terminal 614 when the source voltage of the MOS switch 607 corresponds to the voltage applied to the gate applied voltage terminal 613. As an example, 5 V and 10 V are applied to the gate applied voltage terminal 613 and the gate applied voltage terminal 614, respectively.

In the first place, an operation of turning off the switch circuit according to the embodiment will be described. When the switch circuit according to the embodiment is to be turned off, voltage at the same level as the source voltage of each of the MOS switches 601, 606, and 609 is applied to each of the gate terminal 610 of the MOS switch 601, the gate terminal 611 of the MOS switch 606, and the gate terminal 612 of the MOS switch 609. In the embodiment, 0 V, 5 V, and 10 V are applied to the gate terminal 610, the gate terminal 611, and the gate terminal 612, respectively.

Accordingly, the gate-to-source voltage becomes 0 V. Thus, the MOS switches 601, 606, and 609 are turned off, and routes on which current flows into the resistors 604 and 608 do not exist. In addition, the gate voltage and the source voltage of the MOS switches 602 and 607 become the same potential, and the MOS switches 602 and 607 are turned off. As a result, routes on which current flows into the resistor 605 do not exist, the gate voltage and the source voltage of the MOS switch 603 become the same potential, and the MOS switch 603 is turned off. By performing the operation, all of the MOS switches in the switch circuit are turned off.

Next, an operation of turning on the switch circuit according to the embodiment will be described. When the switch circuit according to the embodiment is to be turned on, voltage is applied to each of the gate terminals 610, 611, and 612, so that the MOS switches 601, 606, and 609 are turned on. As an example, 5V, 10V, and 15V are applied to the gate terminal 610, the gate terminal 611, and the gate terminal 612, respectively, so that the gate-to-source voltage of each MOS switch becomes 5V.

When a predetermined level of voltage is applied to each of the gate terminals 610, 611, and 612, the MOS switches 601, 606, and 609 are turned on, the source voltage of the MOS switch 607 becomes 5 V, and the gate voltage thereof becomes 10 V. Further, the source voltage of the MOS 602 becomes 0 V, the gate voltage thereof becomes 5 V, and the MOS switches 607 and 602 are turned on. Further, the source voltage of the MOS switch 603 becomes 0 V, the gate voltage thereof becomes 5 V, and the MOS switch 603 is turned on. As a result, the entire switch of FIG. 8 is turned on, and the ground is connected to the high-voltage terminal.

Figure 11:
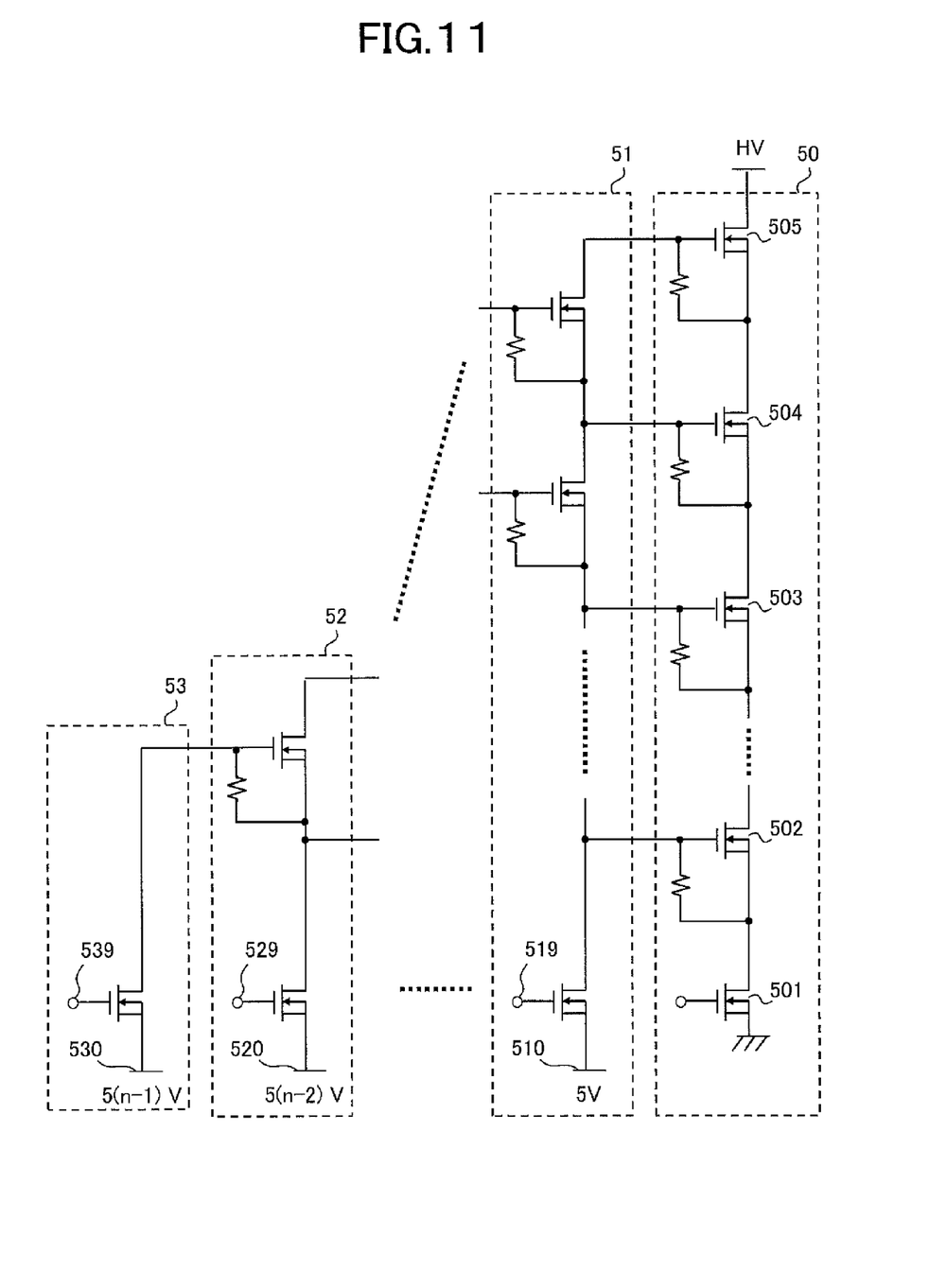
FIG. 11 is a circuit diagram for showing a configuration of the switch circuit according to the embodiment of the present invention.

FIG. 11 is a diagram for showing a case in which the switch circuit described in FIG. 10 is configured to have n stages. The switch circuit shown in FIG. 11 has a multistage configuration in which MOS switches 501, 502, 503, 504, and 505 of n stages are connected. A multistage connection configuration circuit 51 having n−1 stages is connected to each gate of the MOS switches 502, 503, 504, and 505, and further a multistage connection configuration circuit having n−2 stages is connected to the gate of each MOS switch included in the multistage connection configuration circuit 51. Accordingly, the circuits are connected up to a two-stage configuration circuit 52 and a one-stage configuration circuit 53.

5 V, 10 V, , , 5(n−2) V, and 5(n−1) V are applied to the gate applied voltage terminals 510, 520, and 530, respectively, in the order from the n−1-stage configuration circuit 51 to the one-stage configuration circuit 53. When voltage at the same level as the source voltage is applied to each of the gate terminals 510, 520, and 530, all of the MOS switches are turned off, as similar to the three-stage configuration. When a source voltage of +5 V is applied, all of the MOS switches are turned on, as similar to the three-stage configuration.

With the above-described configuration, according to the switch circuit of the embodiment, the multistage MOS switch circuit having three or more stages can be configured using a simplified configuration. Further, if the MOS switches 501, 502, 503, 504 and 505 of FIG. 11 are manufactured using the same wafer, variation of each impedance of the MOS switches 501, 502, 503, 504 and 505 can be prevented from occurring, and high voltage can be evenly divided between the drain and the source of each MOS switch when the switch circuit is turned off.

Further, the MOS switches 501, 502, 503, 504 and 505 are linearly arranged in series at regular intervals between the high-voltage terminal and the ground on the circuit and the creeping distances between the MOS switches are equalized to realize the symmetry of impedance on the layout of the circuit substrate. Accordingly, high voltage can be evenly divided between the drain and the source of each MOS switch when the switch circuit is turned off.

The drain-to-source withstand voltage is 1.5 kV in some N-channel MOSFETs. On the other hand, if the high-voltage power source of a mass spectrometer is, for example, 7 kV, the withstand voltage of the entire switch is 7.5 kV on the assumption that n=5 in the n-stage switch circuit and MOSFETs with a drain-to-source withstand voltage of 1.5 kV are used. Accordingly, the switch can be used as a switch for the power source of the mass spectrometer.

Fourth Embodiment

Figure 12:
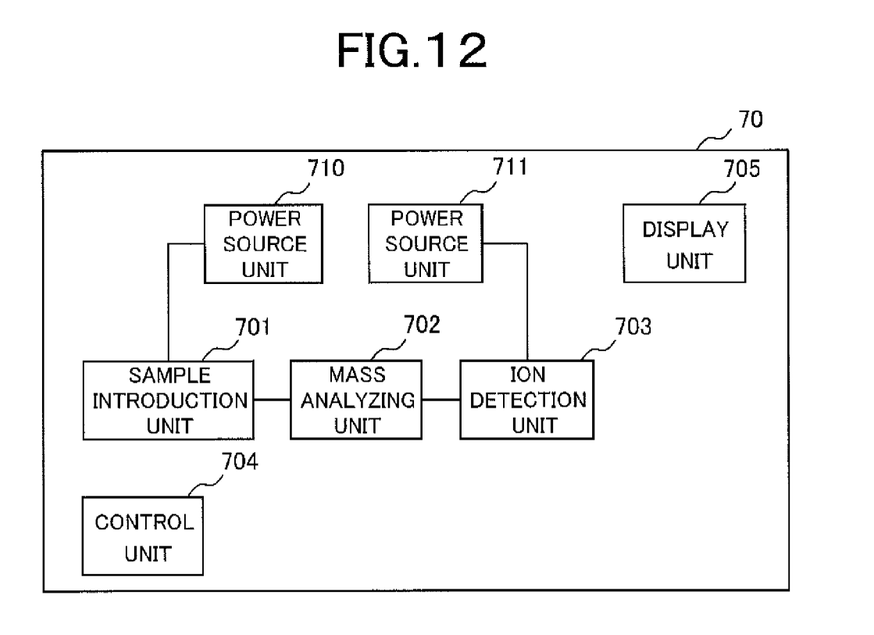
FIG. 12 is a diagram for showing a configuration of a mass spectrometer according to the embodiment of the present invention.

In the embodiment, a mass spectrometer using the above-described switch circuit will be described. FIG. 12 is a block diagram for showing a configuration of a mass spectrometer 70 according to the embodiment. As shown in FIG. 12, the mass spectrometer 70 according to the embodiment includes power source units 710 and 710, a sample introduction unit 701, a mass analyzing unit 702, an ion detection unit 703, a control unit 704, and a display unit 705. With such a configuration, the mass spectrometer 70 according to the embodiment ionizes a sample to fly, and obtains the mass from ion detection time on the basis of a difference of time-of-flight due to the mass.

Specifically, in the mass spectrometer 70, the sample to be analyzed is introduced to the sample introduction unit 701. The sample introduction unit 701 ionizes the sample using an output from the power source unit 710 to be sent to the mass analyzing unit 702. The mass analyzing unit 702 allows the ions to fly to be sent to the ion detection unit 703. An output from the power source unit 711 is applied to the ion detection unit 703, so that the ions are accelerated, and the ion detection unit 703 converts the incoming ions to electricity to detect the mass by arranging the same in order of time. The control unit 704 controls these operations to generate a mass spectrum by calculating the detection intensity according to mass. The display unit 705 displays the mass spectrum generated by the control unit 704.

Figure 13:
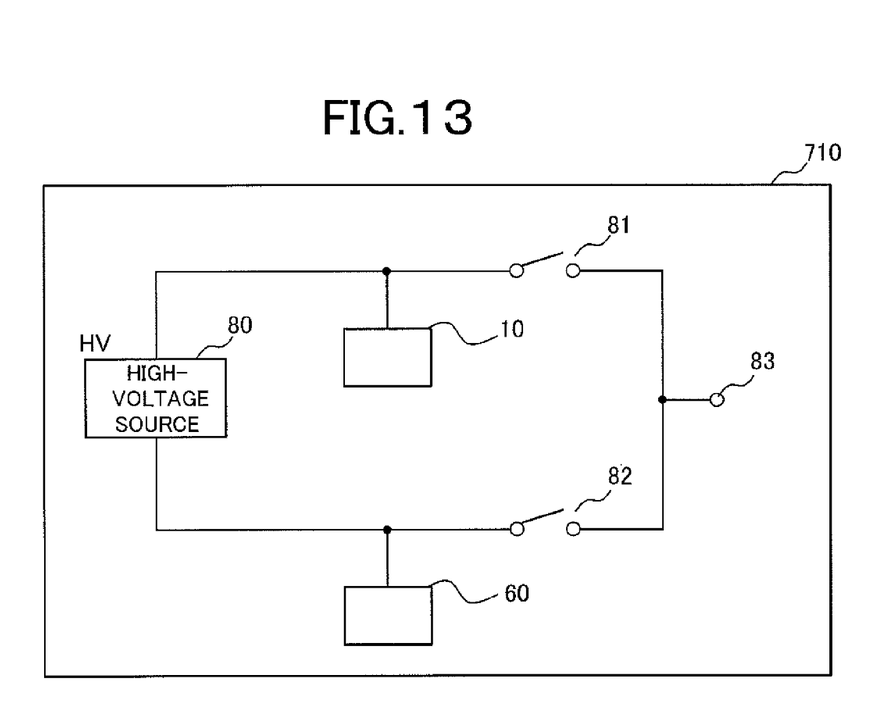
FIG. 13 is a diagram for showing a configuration of a power source unit according to the embodiment of the present invention.

FIG. 13 shows a configuration of the power source unit 710. The power source unit 710 is configured using a floating high-voltage source 80, a switch circuit 10, a switch circuit 60 using P-channel MOS switches, passage switches 81 and 82, and an output terminal 83. As the switch circuit 10, used is one of the switch circuits described in FIGS. 1, 4, 5, 6, 10, and 11. Further, as the switch circuit 60, used is a switch circuit that performs operations in polarity opposite to the switch circuits described in FIGS. 1, 4, 5, 6, 10, and 11, as the switch circuit described in FIG. 3 for the switch circuit described in FIG. 1.

When the power source unit 710 turns on the switch circuit 10 and the passage switch 82 and turns off the switch circuit 60 and the passage switch 81, the high voltage side of the high-voltage source 80 serving as a potential-difference generation unit is connected to the ground. At the same time, the constant voltage side thereof is connected to the output terminal 83, and thus negative high voltage is output from the output terminal 83. On the contrary, when the switch circuit 10 and the passage switch 82 are turned off and the switch circuit 60 and the passage switch 81 are turned on, the low voltage side of the high-voltage source 80 is connected to the ground. At the same time, the high voltage side thereof is connected to the output terminal 83, and thus positive high voltage is output from the output terminal 83. Specifically, the passage switches 81 and 82 function as power source output switching units, and one of the high voltage side and the low voltage side of the high-voltage source is lowered to the system ground by the switch circuits 10 and 60. Thus, the positive or negative of the output power source is switched.

Figure 14:
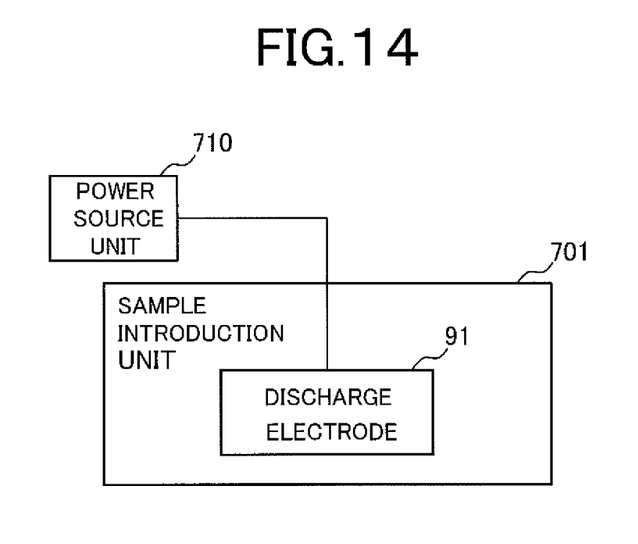
FIG. 14 is a diagram for showing a configuration of a sample introduction unit according to the embodiment of the present invention.

The configuration of the power source unit 711 is the same as that of the power source unit 710. However, the voltage value and waveform of the high-voltage source 80 may be different from those of 710. FIG. 14 is a diagram for showing a configuration of applying an output of the power source unit 710 to the sample introduction unit 701. The sample introduction unit includes a discharge electrode 91 that ionizes the sample. The positive or negative of the output from the power source unit 710 is switched by the switching operation, so that the positive or negative of the generated ions can be switched.

Figure 15:
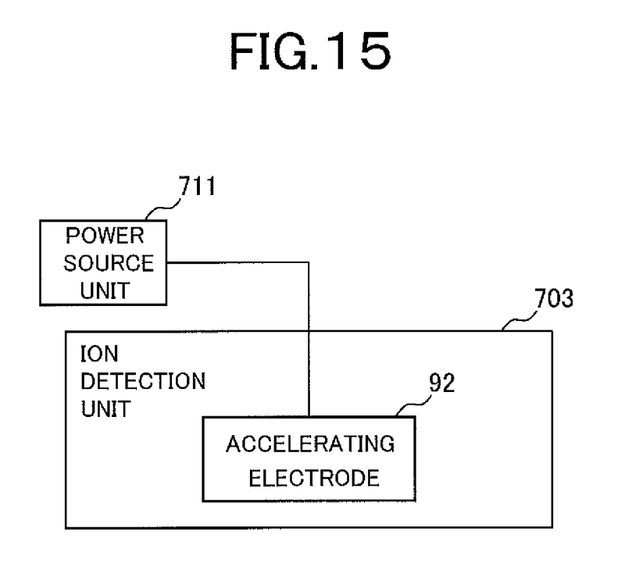
FIG. 15 is a diagram for showing a configuration of an ion detection unit according to the embodiment of the present invention.

FIG. 15 is a diagram for showing a configuration of applying an output of the power source unit 711 to the ion detection unit 703. The sample introduction unit includes an accelerating electrode 92 that accelerates the ions of the sample. The positive or negative of the output from the power source unit 711 is switched by the switching operation, so that the positive or negative of the accelerating ions can be switched.

As described above, a mass spectrometer that can detect both of positive and negative ions can be configured by using the power source units using the switch circuits.

REFERENCE SIGNS LIST 10, 20, 60 switch circuit
51 n–1-stage configuration circuit
52 two-stage configuration circuit
53 one-stage configuration circuit
70 mass spectrometer
80 high-voltage source
81, 82 passage switch
83 output terminal
91, 92 discharge electrode
101, 102, 103, 201, 202, 203, 206, 301, 302, 303, 304, 501, 502, 503, 504, 505, 601, 602, 603, 606, 607, 609 MOS switch
104, 204, 205, 604, 605, 608 resistor
11 high-voltage terminal
12 ground terminal
111, 113, 211, 213, 519, 529, 539, 610, 611, 612 gate terminal
112, 212, 214, 510, 520, 530, 613, 614 gate applied voltage terminal
311, 312, 313 switch circuit
701 sample introduction unit
702 mass analyzing unit
703 ion detection unit
704 control unit
705 display unit
710 power source unit
711 power source unit

The invention claimed is:

1. A switch circuit that includes plural transistor elements connected in series in such a manner that the source of one element is connected to the drain of another between high voltage and a system ground and that switches a connection state between the high voltage and the system ground, the switch circuit comprising:
 a first transistor element the source of which is connected to the system ground among the plural transistor elements;
 a second transistor element the source of which is connected to the drain of the first transistor element in a shared manner and the drain of which is connected to the high voltage side among the plural transistor elements;
 a third transistor element the drain of which is connected to the gate of the second transistor element in a shared manner; and
 a resistor element that is connected in parallel between the gate and the source of the second transistor element,
 wherein: voltage enough to turn on the second transistor element is applied to the source of the third transistor element when the source of the second transistor element is the system ground;
 the first transistor element and the third transistor element are turned off to turn off the second transistor element, so that the high voltage is disconnected from the system ground; and
 the first transistor element and the third transistor element are turned on to turn on the second transistor element, so that the high voltage is connected to the system ground.

2. The switch circuit according to claim 1, further comprising a voltage-dividing resistor element connected in parallel between the drain and the source of each of the plural transistor elements.

3. The switch circuit according to claim 1, further comprising:
 a fourth transistor element the source of which is connected to the drain of the second transistor element in a shared manner and the drain of which is connected to the high potential side among the plural transistor elements;
 a second resistor element that is connected in parallel between the gate and the source of the second transistor element; and
 a gate signal control circuit which is a circuit having the same connection relation as that configured using the first transistor element, the second transistor element, the third transistor element, and the resistor element and in which the drain of a fifth transistor element corresponding to the second transistor element is connected to the gate of the fourth transistor element in a shared manner,
 wherein: the second transistor element is turned off and the fifth transistor element is turned off, so that the high voltage is disconnected from the system ground; and
 the second transistor element is turned on and the fifth transistor element is turned on, so that the high voltage is disconnected from the system ground.

4. The switch circuit according to claim 3,
wherein: the drain of the transistor element connected to the highest potential side in a circuit in which the transistor elements the number of which is the same as that of the plural transistor elements connected in series on the system ground side relative to the transistor elements are connected in series is connected to the gate of each of the plural transistor elements; and the drain of the transistor element connected to the highest voltage side in a circuit in which the transistor elements the number of which is the same as that of the plural transistor elements connected in series on the low voltage side relative to the transistor elements are connected in series is connected to the gate of each of the all transistor elements included in the circuit.

5. The switch circuit according to claim 1, wherein the gate control timing of the first transistor element is set later than the gate control timing of the third transistor element when switching the connection state between the high voltage and the system ground.

6. The switch circuit according to claim 4, wherein the gate control timing contributing to ON/OFF control of the transistor element connected to the system ground side among the plural transistor elements is set later than the gate control timing contributing to ON/OFF control of the transistor element connected to the high voltage side among the plural transistor elements when switching the connection state between the high voltage and the system ground.

7. The switch circuit according to claim 5, further comprising a delay circuit that delays the gate control timing contributing to ON/OFF control of the plural transistor elements by delaying and outputting an input signal.

8. The switch circuit according to claim 1, further comprising:
an n-stage configuration circuit that is a circuit in which n pieces of transistor elements are connected in series and the resistor elements are connected between the gates and the sources of the transistor elements other than the first transistor element; and
an n−1-stage configuration circuit that is a circuit in which n−1 pieces of transistor elements are connected in series and in which the resistor elements are connected between the gates and the sources of the transistor elements other than those to the sources of which the other transistor elements are not connected,
wherein: the transistor elements other than the first transistor element include the second transistor element;
the transistor elements to the sources of which the other transistor elements are not connected are the third transistor elements; and
the gates of the transistor elements included in the n-stage configuration circuit are connected to connection points of the n−1 pieces of transistor elements, in a shared manner, that are connected in series in the n−1-stage configuration circuit.

9. The switch circuit according to claim 1, wherein the plural transistor elements connected in series are of the same kind.

10. The switch circuit according to claim 1, wherein the plural transistor elements are arranged on a substrate at regular intervals, and the creeping distance between the source of one transistor element and the drain of another transistor element connected to the source is arranged to be the same between the transistor elements.

11. A mass spectrometer that allows an ionized sample to fly under a voltage-applied reduced pressure or in a vacuum space and analyzes the mass of the sample by detecting the flying manner,
wherein a power source unit that applies voltage to the space includes:
a potential-difference generation unit that generates a difference between ground potential and insulated potential;
a power source output switching unit that switches a connection state between the low potential side and the high potential side of the potential-difference generation unit and a power source output; and
the switch circuit according to claim 1, and
wherein one of the low potential side and the high potential side of the potential-difference generation unit is grounded by the switch circuit, so that the direction of the voltage applied to the space is switched.

12. A control method for a switch circuit that includes plural transistor elements connected in series in such a manner that the source of one element is connected to the drain of another between high voltage and a system ground and that switches a connection state between the high voltage and the system ground, the switch circuit including:
a first transistor element the source of which is connected to the system ground among the plural transistor elements;
a second transistor element the source of which is connected to the drain of the first transistor element in a shared manner and the drain of which is connected to the high voltage side among the plural transistor elements;
a third transistor element the drain of which is connected to the gate of the second transistor element in a shared manner; and
a resistor element that is connected in parallel between the gate and the source of the second transistor element,
the control method comprising the steps of:
applying voltage enough to turn on the second transistor element to the source of the third transistor element when the source of the second transistor element is the system ground;
disconnecting the high voltage from the system ground by turning off the first transistor element and the third transistor element to turn off the second transistor element; and
connecting the high voltage to the system ground by turning on the first transistor element and the third transistor element to turn on the second transistor element.

* * * * *